United States Patent
Jiang et al.

(10) Patent No.: US 7,605,724 B2
(45) Date of Patent: Oct. 20, 2009

(54) METHOD AND APPARATUS FOR A TRANSMISSION SIGNAL UP-CONVERTING FILTER

(75) Inventors: Steve Xuefeng Jiang, Fremont, CA (US); Simon Xu, San Jose, CA (US)

(73) Assignee: Marvell World Trade Ltd., St. Michael (BB)

( * ) Notice: Subject to any disclaimer, the term of this patent is extended or adjusted under 35 U.S.C. 154(b) by 324 days.

(21) Appl. No.: 11/306,795

(22) Filed: Jan. 11, 2006

(65) Prior Publication Data

US 2007/0018876 A1 Jan. 25, 2007

Related U.S. Application Data

(60) Provisional application No. 60/644,248, filed on Jan. 14, 2005.

(51) Int. Cl.
*H03M 7/00* (2006.01)
(52) U.S. Cl. .......................... 341/61; 332/103
(58) Field of Classification Search ................... 341/61; 332/103; 375/260, 296, 302
See application file for complete search history.

(56) References Cited

U.S. PATENT DOCUMENTS

| | | | |
|---|---|---|---|
| 6,194,977 B1 * | 2/2001 | Wang | 332/103 |
| 6,597,727 B2 * | 7/2003 | Philips et al. | 375/147 |
| 6,996,200 B2 | 2/2006 | Schubert et al. | |
| 2004/0170226 A1 * | 9/2004 | Agazzi | 375/260 |
| 2005/0220219 A1 * | 10/2005 | Jensen | 375/302 |

OTHER PUBLICATIONS

Yoichi Matsumoto, Shuji Kubota, Shuzo Kato; "High-Performance Coherent Demodulator LSIC for Wireless Personal Communications"; IEEE Transactions on Vehicular Technology, vol. 45, No. 3, Aug. 1996; pp. 475-483.
International Search Report from the PCT dated Aug. 18, 2006 International Application No. PCT/US06/01446; 4 pages.
Written Opinion from the PCT dated Aug. 18, 2006 for International Application No. PCT/US06/01446; 4 pages.

* cited by examiner

*Primary Examiner*—Rexford N Barnie
*Assistant Examiner*—Joseph Lauture

(57) ABSTRACT

A digital up-sampling converter (DUSC) employs a signal input provided by a digital signal process (DSP) at a first rate feeding a Square Root Raised Cosine (SRRC) filter which provides for table look up of filter coefficients for a multiple symbol span and provides a sampling output at a second rate which is a multiple M of the first rate. A digital to analog converter (DAC) receives the sampling output at the second rate for conversion to an analog signal and a low pass analog filter processes the analog signal for delivery to an RF transmitter.

10 Claims, 3 Drawing Sheets

METHOD AND APPARATUS FOR A TRANSMISSION SIGNAL UP-CONVERTING FILTER

REFERENCE TO RELATED APPLICATIONS

This application claims the priority of U.S. Provisional Application Ser. No. 60/644,248 filed on Jan. 14, 2005 having the same title as the present application.

FIELD OF THE INVENTION

This invention relates generally to the field of baseband processing of transmission signals and, more particularly, to an up-converting filter implementation without the use of multipliers.

BACKGROUND OF THE INVENTION

Legacy communications systems such as the Personal Handy-phone System (PHS) are configured to be simple and low cost. Upgrading of these systems employing newer available technologies while maintaining the basic simplicity allowed by the PHS system specifications provides very cost effective yet powerful systems with improved signal performance. The availability of Digital Signal Processors (DSP) as a newly cost effective basic building block for the system provides an enhanced basic capability for both the modulation and transmitter paths as well as the demodulation and receiver paths.

Elimination of multipliers limits the hardware requirements for the base band integrated circuit (BBIC) for the transmission path in advanced PHS systems. It is therefore desirable to provide a digital up-sampling converter with a Square Root Raised Cosine (SRRC) filter capability for pulse shaping of the base band signal without the use of multipliers.

SUMMARY OF THE INVENTION

A digital up-sampling converter (DUSC) incorporating the present invention provides a signal input provided by a digital signal process (DSP) at a first rate feeding a Square Root Raised Cosine (SRRC) filter which provides for table look up of filter coefficients for a multiple symbol span and provides a sampling output at a second rate which is a multiple M of the first rate. A digital to analog converter (DAC) receives the sampling output at the second rate for conversion to an analog signal and a low pass analog filter processes the analog signal for delivery to an RF transmitter.

In one embodiment of the invention table look-up is accomplished using a symbol index generated by an encoding mapper for the symbol stream. A secondary look-up table having 3 bit entries selected by the symbol index and a shift register with N taps receives as an input the least significant bit of the secondary table entry. A first array of tables of filter coefficients modified by 0.7071 is provided with each table in the first array connected to a respective tap of the shift register and has corresponding filter coefficients. The first array of tables is selected by a first value of the most significant bit of the secondary look-up table value. A second array of tables of filter coefficients modified by 1 is also provided with each table in the second array connected to a respective tap of the shift register and having corresponding filter coefficients. The second array of tables is selected by a second value of the most significant bit of the secondary look-up table value. A two's compliment function array operates on the output of the first array of tables and a first multiplexer array receives the outputs of the respective two's compliment function array and the second array of tables. Each of the first multiplexers is responsive to the second bit of the secondary look-up table value. A second multiplexer array receives the outputs of the respective first multiplexer array and a zero value with each of the second multiplexers responsive to the least significant bit of the secondary look-up table value. A summer receives the outputs of each multiplexer in the second multiplexer array to provide the filtered value for digital to analog conversion and further analog filtering prior to the RF section.

BRIEF DESCRIPTION OF THE DRAWINGS

These and other features and advantages of the present invention will be better understood by reference to the following detailed description when considered in connection with the accompanying drawings wherein.

DETAILED DESCRIPTION OF THE INVENTION

Figure 1:
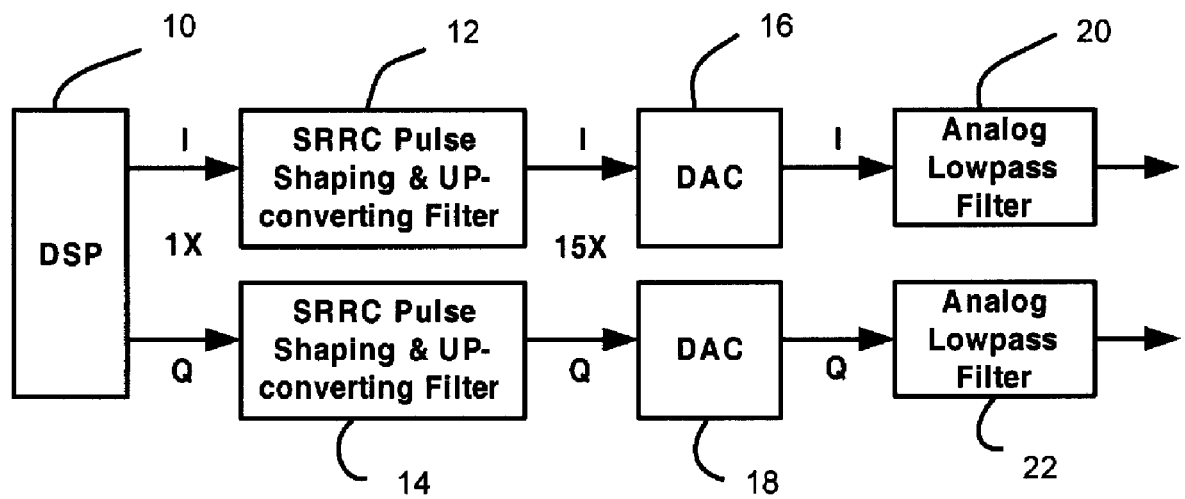
FIG. 1 is a block diagram of a transmitter baseband signal path architecture in which the present invention is employed.

The present invention is defined for an exemplary embodiment employed with a PHS communication system and standard. An RF chip to be used with the PHS BBIC embodiment disclosed herein employs an analog I, Q signal with 43.2 MHz specified for the system clock. A good choice for the DAC sampling rate is then 15X (2.88MHz). The exemplary base band transmitter signal path is shown in FIG. 1. A DSP 10 provides the I and Q signals at the system clock rate. SRRC pulse shaping and up-converting filters 12 and 14 provide the I and Q signals at 15X rate to the Digital to Analog Converters (DAC) 16 and 18. The resulting analog I and Q signals are then processed through analog low pass filters 20 and 22 for transmission. For the embodiment shown, the SRRC is as specified in RCR standard STD-28 with a roll-off factor $\alpha=0.5$.

As examples for potential implementation of the present invention, an SRRC with a 4 symbol span will have coefficients as shown in Table 1. Tables 2 and 3 show the coefficients for a 7 symbol span and 8 symbol span respectively.

TABLE 1

| H (1:15:46) | 4 | −10 | 106 | −10 |
| H (2:15:47) | 4 | −5 | 105 | −13 |
| H (3:15:48) | 3 | 1 | 101 | −15 |
| H (4:15:49) | 2 | 8 | 96 | −15 |
| H (5:15:50) | 1 | 17 | 89 | −14 |
| H (6:15:51) | −1 | 27 | 80 | −13 |
| H (7:15:52) | −3 | 37 | 70 | −11 |
| H (8:15:53) | −6 | 48 | 59 | −8 |
| H (9:15:54) | −8 | 59 | 48 | −6 |
| H (10:15:55) | −11 | 70 | 37 | −3 |
| H (11:15:56) | −13 | 80 | 27 | −1 |
| H (12:15:57) | −14 | 89 | 17 | 1 |
| H (13:15:58) | −15 | 96 | 8 | 2 |
| H (14:15:59) | −15 | 101 | 1 | 3 |
| H (15:15:60) | −13 | 105 | −5 | 4 |

TABLE 2

| H (1:15:91): | 1 | −1 | −8 | 58 | 48 | −6 | −2 |
| H (2:15:92): | 1 | 0 | −11 | 69 | 37 | −3 | −2 |
| H (3:15:93): | 2 | 0 | −13 | 79 | 26 | −1 | −2 |
| H (4:15:94): | 2 | 1 | −14 | 8 | 17 | 1 | −2 |
| H (5:15:95): | 1 | 2 | −15 | 94 | 8 | 2 | −1 |
| H (6:15:96): | 1 | 3 | −14 | 100 | 1 | 3 | −1 |
| H (7:15:97): | 1 | 4 | −13 | 103 | −5 | 4 | 0 |

TABLE 2-continued

| | | | | | | | |
|---|---|---|---|---|---|---|---|
| H (8:15:98): | 0 | 4 | −10 | 104 | −10 | 4 | 0 |
| H (9:15:99): | 0 | 4 | −5 | 103 | −13 | 4 | 1 |
| H (10:15:100) | −1 | 3 | 1 | 100 | −14 | 3 | 1 |
| H (11:15:101) | 1 | 2 | 8 | 94 | −15 | 2 | 1 |
| H (12:15:102) | −2 | 1 | 17 | 87 | −14 | 1 | 2 |
| H (13:15:103) | −2 | −1 | 26 | 79 | −13 | 0 | 2 |
| H (14:15:104) | −2 | −3 | 37 | 69 | −11 | 0 | 1 |
| H (15:15:105) | −2 | −6 | 48 | 58 | −8 | −1 | 1 |

TABLE 3

| | | | | | | | |
|---|---|---|---|---|---|---|---|
| H (1:15:106): | −1 | 0 | 4 | −10 | 104 | −10 | 4 | 0 |
| H (2:15:107): | −1 | 0 | 4 | −5 | 103 | −13 | 4 | 1 |
| H (3:15:108): | −1 | −1 | 3 | 1 | 100 | −14 | 3 | 1 |
| H (4:15:109): | −1 | −1 | 2 | 8 | 95 | −15 | 2 | 1 |
| H (5:15:110): | 0 | −2 | 1 | 17 | 88 | −14 | 1 | 2 |
| H (6:15:111): | 0 | −2 | −1 | 26 | 79 | −13 | 0 | 2 |
| H (7:15:112): | 0 | −2 | −3 | 37 | 69 | −11 | 0 | 1 |
| H (8:15:113): | 1 | −2 | −6 | 48 | 59 | −8 | −1 | 1 |
| H (9:15:114): | 1 | −1 | −8 | 59 | 48 | −6 | −2 | 1 |
| H (10:15:115) | 1 | 0 | −11 | 69 | 37 | −3 | −2 | 0 |
| H (11:15:116) | 2 | 0 | −13 | 79 | 26 | −1 | −2 | 0 |
| H (12:15:117) | 2 | 1 | −14 | 88 | 17 | 1 | −2 | 0 |
| H (13:15:118) | 1 | 2 | −15 | 95 | 8 | 2 | −1 | −1 |
| H (14:15:119) | 1 | 3 | −14 | 100 | 1 | 3 | −1 | −1 |
| H (15:15:120) | 1 | 4 | −13 | 103 | −5 | 4 | 0 | −1 |

Figure 2:
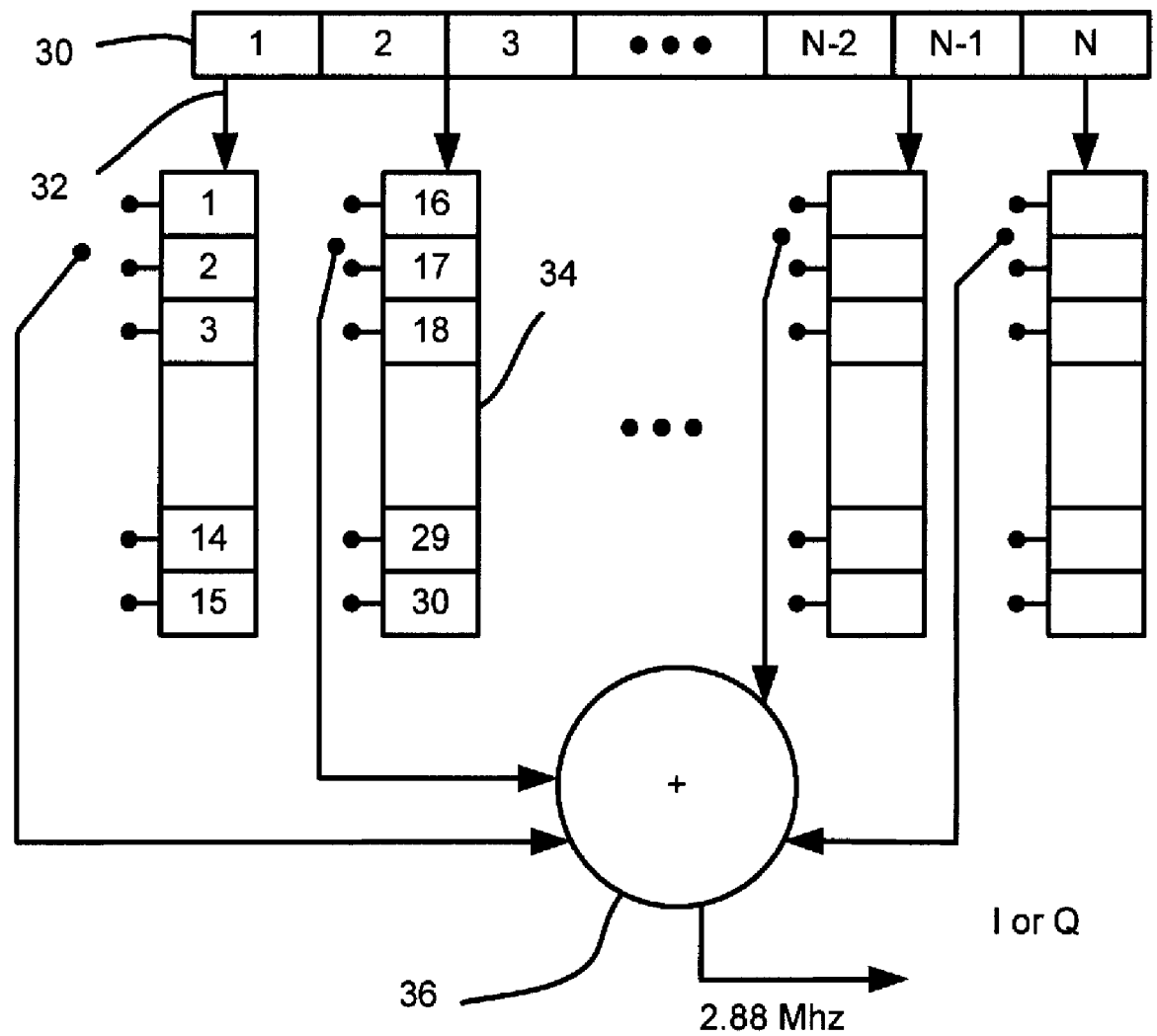
FIG. 2 is a block diagram of the basic implementation of an SRRC filter using a table look-up approach according to the present invention; and, FIG. 3 is a block diagram of a hardware implementation of the present invention.

For transmission using (/4 DQPSK, the encoder will generate four values, namely −1, −0.7071, 0.7071 and 1. The input to the SRRC filter will be the coded symbol stream. As illustrated in FIG. 2, the coded symbol stream will go through a shift register pipeline 30 at 1X (192 KHz). For every new coded symbol coming in, at each tap 32 of N (symbol span) taps in the poly phase filter there will be a new 15 entry table 34 selected for poly phase filtering. Then, at 15X (2.88 MHz) rate the table entries are provided to summer 36 and there are one I and one Q sample output from the filter pair 20 and 22 of FIG. 1.

The values for 0.7071, −0.7071 and −1 of Table 1 are shown in Tables 4, 5 and 6.

TABLE 4

| | | | |
|---|---|---|---|
| 3 | −7 | 75 | −7 |
| 3 | −4 | 74 | −9 |
| 2 | 0 | 72 | −10 |
| 2 | 6 | 68 | −11 |
| 1 | 12 | 63 | −10 |
| −1 | 19 | 57 | −9 |
| −2 | 26 | 50 | −8 |
| −4 | 34 | 42 | −6 |
| −6 | 42 | 34 | −4 |
| −8 | 50 | 26 | −2 |
| −9 | 57 | 19 | −1 |
| −10 | 63 | 12 | 1 |
| −11 | 68 | 6 | 2 |
| −10 | 72 | 0 | 2 |
| −9 | 74 | −4 | 3 |

TABLE 5

| | | | |
|---|---|---|---|
| −3 | 7 | −75 | 7 |
| −3 | 4 | −74 | 9 |
| −2 | 0 | −72 | 10 |
| −2 | −6 | −68 | 11 |
| −1 | −12 | −63 | 10 |
| 1 | −19 | −57 | 9 |
| 2 | −26 | −50 | 8 |
| 4 | −34 | −42 | 6 |
| 6 | −42 | −34 | 4 |

TABLE 5-continued

| | | | |
|---|---|---|---|
| 8 | −50 | −26 | 2 |
| 9 | −57 | −19 | 1 |
| 10 | −63 | −12 | −1 |
| 11 | −68 | −6 | −2 |
| 10 | −72 | 0 | −2 |
| 9 | −74 | 4 | −3 |

TABLE 6

| | | | |
|---|---|---|---|
| −4 | 10 | −106 | 10 |
| −4 | 5 | −105 | 13 |
| −3 | −1 | −101 | 15 |
| −2 | −8 | −96 | 15 |
| −1 | −17 | −89 | 14 |
| 1 | −27 | −80 | 13 |
| 3 | −37 | −70 | 11 |
| 6 | −48 | −59 | 8 |
| 8 | −59 | −48 | 6 |
| 11 | −70 | −37 | 3 |
| 13 | −80 | −27 | 1 |
| 14 | −89 | −17 | −1 |
| 15 | −96 | −8 | −2 |
| 15 | −101 | −1 | −3 |
| 13 | −105 | 5 | −4 |

Similarly, if a 7 symbol span is employed, the values for 0.7071, −0.7071 and −1 of Table 2 are shown in Tables 7, 8 and 9.

TABLE 7

| | | | | | | |
|---|---|---|---|---|---|---|
| 1 | 0 | −9 | 58 | 31 | −3 | −2 |
| 1 | 0 | −11 | 67 | 22 | −1 | −2 |
| 1 | 1 | −12 | 74 | 14 | 1 | −1 |
| 1 | 2 | −12 | 80 | 7 | 2 | −1 |
| 1 | 2 | −12 | 84 | 1 | 3 | −1 |
| 1 | 3 | −11 | 87 | −4 | 3 | 0 |
| 0 | 3 | −8 | 88 | −8 | 3 | 0 |
| 0 | 3 | −4 | 87 | −11 | 3 | 1 |
| −1 | 3 | 1 | 84 | −12 | 2 | 1 |
| −1 | 2 | 7 | 80 | −12 | 2 | 1 |
| −1 | 1 | 14 | 74 | −12 | 1 | 1 |
| −2 | −1 | 22 | 67 | −11 | 0 | 1 |
| −2 | −3 | 31 | 58 | −9 | 0 | 1 |
| −1 | −5 | 40 | 49 | −7 | −1 | 1 |

TABLE 8

| | | | | | | |
|---|---|---|---|---|---|---|
| −1 | 1 | 7 | −49 | −40 | 5 | 1 |
| −1 | 0 | 9 | −58 | −31 | 3 | 2 |
| −1 | 0 | 11 | −67 | −22 | 1 | 2 |
| −1 | −1 | 12 | −74 | −14 | −1 | 1 |
| −1 | −2 | 12 | −80 | −7 | −2 | 1 |
| −1 | −2 | 12 | −84 | −1 | −3 | 1 |
| −1 | −3 | 11 | −87 | 4 | −3 | 0 |
| 0 | −3 | 8 | −88 | 8 | −3 | 0 |
| 0 | −3 | 4 | −87 | 11 | −3 | −1 |
| 1 | −3 | −1 | −84 | 12 | −2 | −1 |
| 1 | −2 | −7 | −80 | 12 | −2 | −1 |
| 1 | −1 | −14 | −74 | 12 | −1 | −1 |
| 2 | 1 | −22 | −67 | 11 | 0 | −1 |
| 2 | 3 | −31 | −58 | 9 | 0 | −1 |
| 1 | 5 | −40 | −49 | 7 | 1 | −1 |

TABLE 9

| | | | | | | |
|---|---|---|---|---|---|---|
| 1 | 1 | 10 | −70 | −57 | 7 | 2 |
| −2 | 1 | 13 | −83 | −44 | 4 | 2 |
| −2 | 0 | 15 | −94 | −31 | 1 | 2 |
| −2 | −1 | 17 | −105 | −20 | −1 | 2 |

TABLE 9-continued

| | | | | | | |
|---|---|---|---|---|---|---|
| -2 | -3 | 18 | -113 | -10 | -3 | 1 |
| -1 | -3 | 17 | -119 | -1 | -4 | 1 |
| -1 | -4 | 15 | -123 | 6 | -5 | 0 |
| 0 | -5 | 12 | -125 | 12 | -5 | 0 |
| 0 | -5 | 6 | -123 | 15 | -4 | -1 |
| 1 | -4 | -1 | -119 | 17 | -3 | -1 |
| 1 | -3 | -10 | -113 | 18 | -3 | -2 |
| 2 | -1 | -20 | -105 | 17 | -1 | -2 |
| 2 | 1 | -31 | -94 | 15 | 0 | -2 |
| 2 | 4 | -44 | -83 | 13 | 1 | -2 |
| 2 | 7 | -57 | -70 | 10 | 1 | -1 |

Finally, if an 8 symbol span is employed, the values for 0.7071, −0.7071 and −1 of Table 3 are shown in Tables 10, 11 and 12.

TABLE 10

| | | | | | | | |
|---|---|---|---|---|---|---|---|
| -1 | 0 | 3 | -7 | 74 | -7 | 3 | 0 |
| -1 | 0 | 3 | -4 | 73 | -9 | 3 | 1 |
| -1 | -1 | 2 | 0 | 71 | -10 | 2 | 1 |
| 0 | -1 | 2 | 6 | 67 | -10 | 1 | 1 |
| 0 | -1 | 1 | 12 | 62 | -10 | 1 | 1 |
| 0 | -1 | -1 | 19 | 56 | -9 | 0 | 1 |
| 0 | -1 | -2 | 26 | 49 | -7 | 0 | 1 |
| 1 | -1 | -4 | 34 | 41 | -6 | -1 | 1 |
| 1 | -1 | -6 | 41 | 34 | -4 | -1 | 1 |
| 1 | 0 | -7 | 49 | 26 | -2 | -1 | 0 |
| 1 | 0 | -9 | 56 | 19 | -1 | -1 | 0 |
| 1 | 1 | -10 | 62 | 12 | 1 | -1 | 0 |
| 1 | 1 | -10 | 67 | 6 | 2 | -1 | 0 |
| 1 | 2 | -10 | 71 | 0 | 2 | -1 | -1 |
| 1 | 3 | -9 | 73 | -4 | 3 | 0 | -1 |

TABLE 11

| | | | | | | | |
|---|---|---|---|---|---|---|---|
| 1 | 0 | 0 | 7 | -74 | 7 | -3 | 0 |
| 1 | 0 | -3 | 4 | -73 | 9 | -3 | -1 |
| 1 | 1 | — | 0 | -71 | 10 | -2 | -1 |
| 0 | 1 | -2 | -6 | -67 | 10 | -1 | -1 |
| 0 | 1 | -1 | -12 | -62 | 10 | -1 | -1 |
| 0 | 1 | 1 | -19 | -56 | 9 | 0 | -1 |
| 0 | 1 | 2 | -26 | -49 | 7 | 0 | -1 |
| -1 | 1 | 4 | -34 | -41 | 6 | 1 | -1 |
| -1 | 1 | 6 | -41 | -34 | 4 | 1 | -1 |
| -1 | 0 | 7 | -49 | -26 | 2 | 1 | 0 |
| -1 | 0 | 9 | -56 | -19 | 1 | 1 | 0 |
| -1 | -1 | 10 | -62 | -12 | -1 | 1 | 0 |
| -1 | -1 | 10 | -67 | -6 | -2 | 1 | 0 |
| -1 | -2 | 10 | -71 | 0 | -2 | 1 | 1 |
| -1 | -3 | 9 | -73 | 4 | -3 | 0 | 1 |

TABLE 12

| | | | | | | | |
|---|---|---|---|---|---|---|---|
| 1 | 0 | -4 | 10 | -104 | 10 | -4 | 0 |
| 1 | 0 | -4 | 5 | -103 | 13 | -4 | -1 |
| 1 | 1 | -3 | -1 | -100 | 14 | -3 | -1 |
| 1 | 1 | -2 | -8 | -95 | 15 | -2 | -1 |
| 0 | 2 | -1 | -17 | -88 | 14 | -1 | -2 |
| 0 | 2 | 1 | -26 | -79 | 13 | 0 | -2 |
| 0 | 2 | 3 | -37 | -69 | 11 | 0 | -1 |
| -1 | 2 | 6 | -48 | -59 | 8 | 1 | -1 |
| -1 | 1 | 8 | -59 | -48 | 6 | 2 | -1 |
| -1 | 0 | 11 | -69 | -37 | 3 | 2 | 0 |
| -2 | 0 | 13 | -79 | -26 | 1 | 2 | 0 |
| -2 | -1 | 14 | -88 | -17 | -1 | 2 | 0 |
| -1 | -2 | 15 | -95 | -8 | -2 | 1 | 1 |
| -1 | -3 | 14 | -100 | -1 | -3 | 1 | 1 |
| -1 | -4 | 13 | -103 | 5 | -4 | 0 | 1 |

As an exemplary embodiment for a direct implementation data format, the data into the SRRC, which with sampling rate conversion constitutes a Digital Up Sampling Converter (DUSC), is the coded symbol stream with a width of 4 bits. The coded symbol is basically the symbol index defined by the mapper implemented as software in the DSP, and will be used by the DUSC to select the right I, Q values from table. The table is of register format and is initialized by the mapper.

Table 13 is a 16 entry symbol index to I, Q value mapping, which is used for up to 16 QAM application. While the present embodiment is drawn to (/4 DQPSK, the example shown in the table can be used as BPSK, QPSK, DQPSK, 8-PSK, pulse shaping.

TABLE 13

| Symbol Index | I (8 bits) | Q (8 bits) |
|---|---|---|
| 0000 | 7F | 0 |
| 0001 | 5A | 5A |
| 0010 | 0 | 7F |
| 0011 | A6 | 5A |
| 0100 | 81 | 0 |
| 0101 | A6 | A6 |
| 0110 | 0 | 81 |
| 0111 | 5A | A6 |
| 1000 | Reserved | Reserved |
| 1001 | Reserved | Reserved |
| 1010 | Reserved | Reserved |
| 1011 | Reserved | Reserved |
| 1100 | Reserved | Reserved |
| 1101 | Reserved | Reserved |
| 1110 | Reserved | Reserved |
| 1111 | Reserved | Reserved |

As an alternative, a look-up table implementation data format is a second embodiment. As in the direct implementation, the data into the DUSC is still the coded symbol stream with the width of 4 bits, but the coded symbol will be used by DUSC to select an I, Q index as shown in the table 14.

TABLE 14

| Symbol Index | I (3 bits) | Q (3 bits) |
|---|---|---|
| 0000 | 101 | 000 |
| 0001 | 100 | 100 |
| 0010 | 000 | 101 |
| 0011 | 110 | 100 |
| 0100 | 111 | 000 |
| 0101 | 110 | 110 |
| 0110 | 000 | 111 |
| 0111 | 100 | 110 |

Three bits for both the I path & Q path are defined as follows:

| | | |
|---|---|---|
| B2: | 0 | zero value. |
| | 1 | non-zero value. |
| B1: | 0 | positive non-zero value. |
| | 1 | negative non-zero value. |
| B0: | 0 | value of 0.7071. |
| | 1 | value of 1. |

Figure 3:
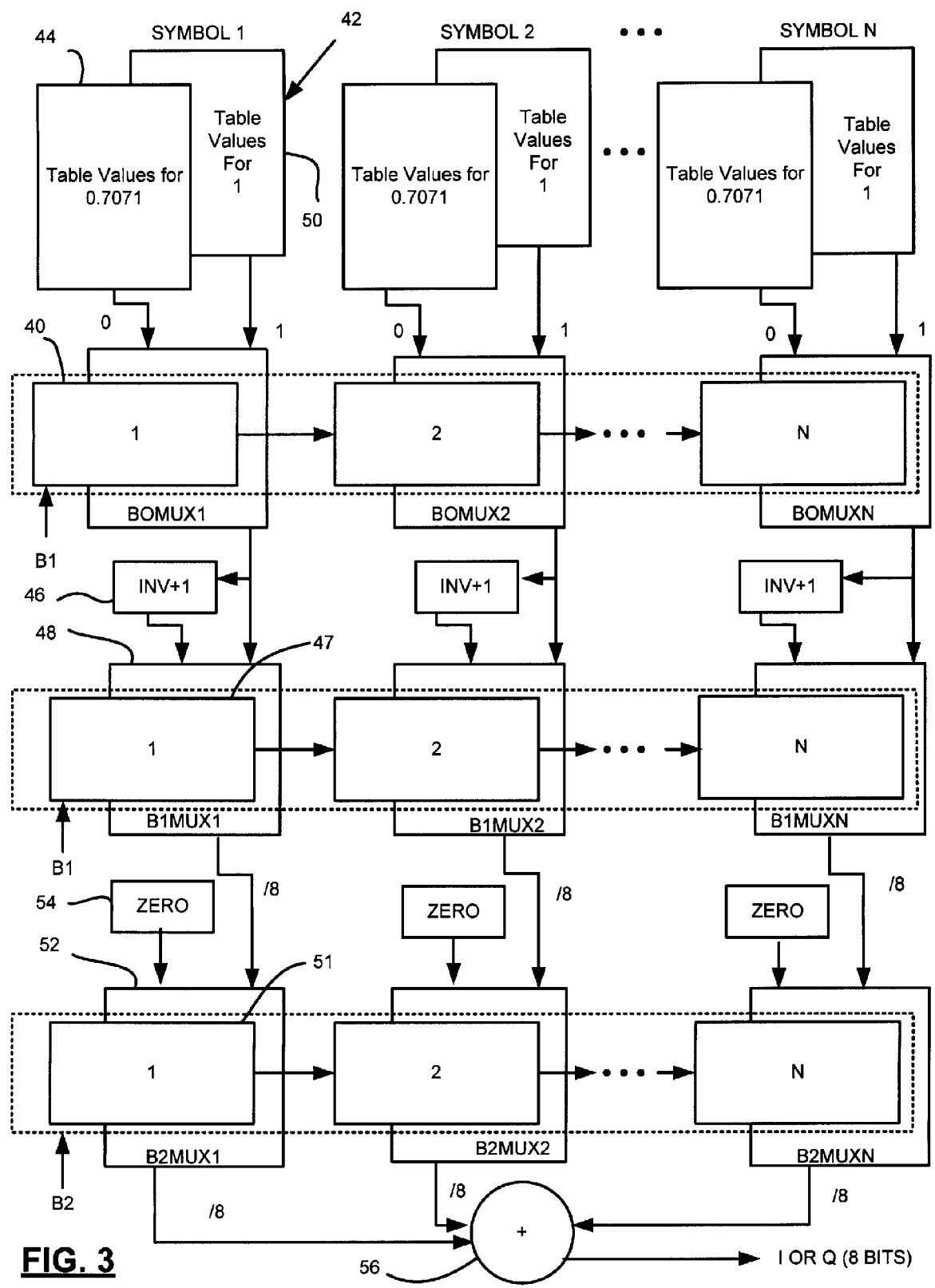

Implementation to provide the filtering portion of the lookup table is then accomplished as shown in FIG. 3. The B0 value is provided as the input to a shift register 40 of length N corresponding to the symbol span. Each tap from the shift register is the start point for a calculation string 42 for one symbol in the span providing a control signal for a first multiplexer 43. Based on the B0 value, as shifted through the register, a 0 value in each symbol calculation string will result in selection by the associated first multiplexer of a value for the associated 0.7071 table element 44 which is provided in 8 bit width. The array of 0.7071 table elements provide the value of coefficients of the filter for the associated tap multiplied by 0.7071 as defined in Table 4 above for this exemplary embodiment shifted at 15 times the symbol rate as previously described with respect to FIG. 2. Similarly, if the B0 value is a 1, a value for the associated "1" table element 50 is provided in 8 bit width from the first multiplexer 43. The array of "1" table elements provide the value of coefficients of the filter for the associated tap multiplied by 1 as shown in Table 1 above.

A second shift register 47 of length N receives the value of B1. The value of B1 as provided by the taps from the second shift register determines the output of an associated second multiplexer 48 which selects from the value provided directly from the first multiplexer or a 2's compliment operation 46 (denoted by INV+1) operating on the output of the first multiplexer. The selected output is then provided in 8 bit width to a third multiplexer 52 which selects from the output of second multiplexer 48 and a zero value 54 based on the value of B2 which is provided through the taps of a third shift register 51 of length N. The outputs of the multiplexers 52 in each symbol calculation string are summed 56 to provide an 8 bit output for either I or Q from the SRRC.

Having now described the invention in detail as required by the patent statutes, those skilled in the art will recognize modifications and substitutions to the specific embodiments disclosed herein. Such modifications are within the scope and intent of the present invention as defined in the following claims.

What is claimed is:

1. A digital up-sampling converter (DUSC) comprising:
a signal input provided by a digital signal processor (DSP) at a first rate;
a Square Root Raised Cosine (SRRC) filter receiving the signal input and having means for table look up of filter coefficients for a multiple symbol span and providing a sampling output at a second rate which is a multiple M of the first rate, where M is an integer greater than 1;
a digital to analog converter (DAC) receiving the sampling output at the second rate for conversion to an analog signal; and
a low pass analog filter processing the analog signal for delivery to an RF transmitter,
wherein the SRRC filter receives filter coefficients for a first symbol while receiving filter coefficients for a second symbol.

2. A DUSC as defined in claim 1 wherein the SRRC filter includes X tables, and
wherein the SRRC filter receives filter coefficients for each of Y symbols in a respective one of the X tables, where X and Y are integers greater than 1.

3. A digital up-sampling converter (DUSC) comprising:
a signal input provided by a digital signal processor (DSP) at a first rate;
a Square Root Raised Cosine (SRRC) filter receiving the signal input and having means for table look up of filter coefficients for a multiple symbol span and providing a sampling output at a second rate which is a multiple M of the first rate, where M is an integer greater than 1;
a digital to analog converter (DAC) receiving the sampling output at the second rate for conversion to an analog signal; and
a low pass analog filter processing the analog signal for delivery to an RF transmitter,
wherein the SRRC filter comprises:
a shift register pipeline operating at the first rate and having N taps equal to the symbol span, where N is an integer greater than 1;
a table at each tap having M entries corresponding to filter coefficients for that tap;
means for selecting table entries based on a symbol characteristic; and
a summer receiving the selected table entry as an output from each of the tables and providing a summed signal output at the second rate.

4. A DUSC as defined in claim 3, wherein the means for selecting table entries comprises:
a symbol index generated by an encoding mapper for the symbol span; and
a pointer responsive to the symbol index for identification of the selected table entry.

5. A digital up-sampling converter (DUSC) comprising:
a signal input provided by a digital signal processor (DSP) at a first rate;
a Square Root Raised Cosine (SRRC) filter receiving the signal input and having means for table look up of filter coefficients for a multiple symbol span and providing a sampling output at a second rate which is a multiple M of the first rate, where M is an integer greater than 1;
a digital to analog converter (DAC) receiving the sampling output at the second rate for conversion to an analog signal; and
a low pass analog filter processing the analog signal for delivery to an RF transmitter,
wherein an encoding scheme is $\pi/4$ DQPSK and the means for table look-up comprises:
a symbol index generated by an encoding mapper for the symbol span;
a secondary look-up table having 3 bit entries selected by the symbol index;
a shift register with N taps receiving as an input the least significant bit of the secondary look-up table entry, where N is an integer greater than 1;
a first array of tables of filter coefficients modified by 0.7071, each table in the first array connected to a respective tap of the shift register and having corresponding filter coefficients and selected by a first value of the most significant bit of the secondary look-up table entry;
a second array of tables of filter coefficients modified by 1, each table in the second array connected to a respective tap of the shift register and having corresponding filter coefficients and selected by a second value of the most significant bit of the secondary look-up table entry;
a two's complement function array operating on the output of the first array of tables;
a first multiplexer array receiving the outputs of the respective two's complement function array and second array of tables, each of the first multiplexers responsive to the second bit of the secondary look-up table entry;
a second multiplexer array receiving the outputs of the respective first multiplexer array and a zero value, each of the second multiplexers responsive to the least significant bit of the secondary look-up table entry; and
a summer receiving the outputs of each multiplexer in the second multiplexer array.

6. A method for filtering a personal handy-phone system (PHS) signal comprising:
providing a signal input from a digital signal process (DSP) at a first rate;
providing a Square Root Raised Cosine (SRRC) filter function to receive the signal input including:

generating a symbol index by an encoding mapper for a symbol stream;

selecting 3 bit entries from a secondary look-up table based on the symbol index;

receiving into a shift register with N taps the least significant bit of the secondary look-up table entry;

providing a first array of tables of filter coefficients modified by 0.7071, each table in the first array connected to a respective tap of the shift register and having corresponding filter coefficients;

providing a second array of tables of filter coefficients modified by 1, each table in the second array connected to a respective tap of the shift register and having corresponding filter coefficients;

selecting between the first and second array respectively based on a first or second value of the most significant bit of the secondary look-up table entry;

providing a two's compliment function array operating on the output of the first array of tables;

selecting through a first multiplexer array the output of the respective two's compliment function array or output of the second array of tables responsive to the second bit of the secondary look-up table entry;

selecting through a second multiplexer array the outputs of the respective first multiplexer array or a zero value responsive to the least significant bit of the secondary look-up table entry; and summing the outputs of each multiplexer in the second multiplexer array;

providing a sampling output at a second rate which is a multiple M of the first rate;

performing digital to analog conversion of sampling output at the second rate for conversion to an analog signal; and processing the analog signal through a low pass analog filter for delivery to an RF transmitter.

7. A digital up-sampling converter comprising:

a digital signal processor that receives an input signal at a first rate, wherein the input signal includes Y symbols;

a square root raised cosine (SRRC) filter that receives the input signal, that receives filter coefficients for each of the Y symbols in X tables, and that generates an output signal based on the filter coefficients; and a digital to analog converter (DAC) that receives the output signal at a second rate that is a multiple M of the first rate and generates an analog signal, where M, X, and Y are integers greater than 1, wherein the SRRC filter receives filter coefficients for a first symbol while receiving filter coefficients for a second symbol.

8. The digital up-sampling converter of claim 7 wherein the SRRC filter receives the filter coefficients for each of the Y symbols in respective ones of the x tables, and wherein filter coefficients for a first one of the Y symbols is modified by a first constant and filter coefficients for a second one of the Y symbols is modified by a second constant.

9. The digital up-sampling converter of claim 7 wherein the SRRC filter further comprises a shift register pipeline that has N taps, wherein each of the N taps is associated with a respective one of the X tables and where N is equal to Y, wherein the SRRC filter receives the filter coefficients in the X tables based on the N taps.

10. The digital up-sampling converter of claim 9 wherein the SRRC filter sums selected entries of the X tables based on corresponding ones of the filter coefficients to generate the output signal.

* * * * *